United States Patent [19]

Payden

[11] 4,105,976
[45] Aug. 8, 1978

[54] AUTOMATIC GAIN CONTROL

[76] Inventor: Floyd Payden, 312 W. State St., Fremont, Ohio 43429

[21] Appl. No.: 746,259

[22] Filed: Dec. 1, 1976

[51] Int. Cl.² .............................................. H04B 1/16
[52] U.S. Cl. ................................... 325/404; 325/408; 325/411; 330/136
[58] Field of Search ................ 325/319, 400, 403–405, 325/408–413, 415; 330/29, 129, 134–136, 138, 139; 179/1 VL

[56] References Cited

U.S. PATENT DOCUMENTS

| | | | |
|---|---|---|---|
| 2,047,003 | 7/1936 | Chittick | 325/409 |
| 2,611,081 | 9/1952 | Spencer | 325/404 |
| 2,731,558 | 1/1956 | Anthun | 325/409 |
| 2,837,635 | 6/1958 | Epperson | 330/135 |
| 2,866,892 | 12/1958 | Barton | 325/408 |
| 3,012,137 | 12/1961 | Riceman | 325/408 |
| 3,488,599 | 1/1970 | Csicsatka | 325/400 |

Primary Examiner—Robert L. Griffin
Assistant Examiner—Jin F. Ng

[57] ABSTRACT

An automatic gain control of a radio receiver is arranged to vary the amplification of the audio amplifier, generally, inversely as the strength of the radio frequency signal appearing at the detector stage of the radio receiver.

2 Claims, 2 Drawing Figures

AUTOMATIC GAIN CONTROL

BACKGROUND OF THE INVENTION

Conventional automatic volume control systems for radio receivers use a signal voltage developed in the detector to control the amplification or gain of the radio frequency and/or intermediate frequency stages of the radio. Thus some variation in gain control signal is required. Also, with amplitude modulated radio systems, the audio frequency output is proportional to the radio or intermediate frequency signal at the detector. It follows that for a given modulation the audio frequency output is proportional to the automatic gain control signal from the detector stage and thus varies with the strength of the radio frequency signal received at the detector. Thus the conventional automatic gain control system can reduce but cannot eliminate changes in audio output with changes in the received signal strength.

It is, accordingly, an object of the invention to vary the amplification of the audio amplifier of a radio generally inversely as the strength of the automatic gain control signal.

SUMMARY OF THE INVENTION

Broadly stated the invention consists in providing a voltage proportional to the automatic gain control signal voltage of a radio, selecting a portion of such voltage, and applying said selected voltage to the first stage of the audio amplifier of the radio to control the amplification of said audio stage.

DESCRIPTION OF A PREFERRED EMBODIMENT

Figure 1:
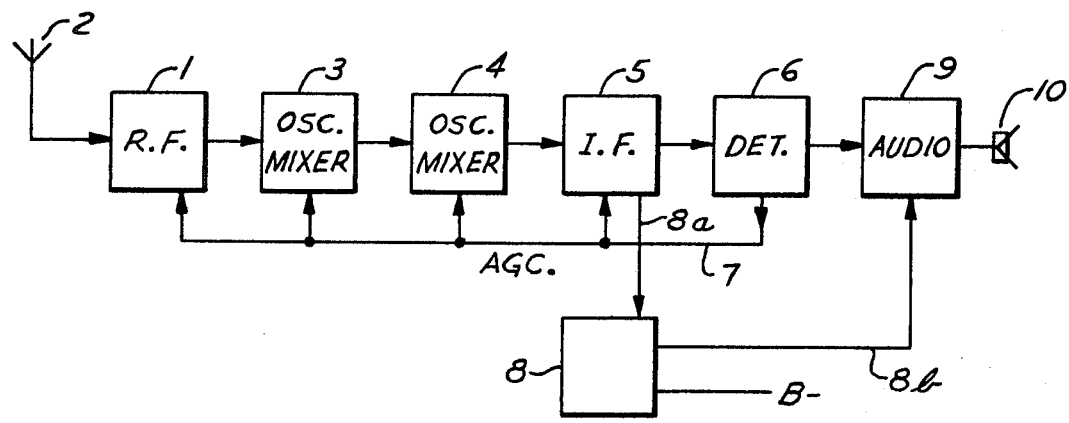
FIG. 1 is a block diagram of a typical radio receiver to which the supplementary automatic gain control has been added.

Referring to FIG. 1, a conventional AM radio receiver comprises a radio frequency amplifier section 1 receiving signals from an antenna 2 and transmitting amplified radio frequency signals to a pair of oscillator-mixers 3, 4 which combine the radio frequency signal with signals from local oscillators. The output of the oscillator-mixer 4 is a modulated intermediate frequency signal. This signal is amplified by a tuned intermediate frequency amplifier 5 and applied to a detector 6 which, in a well known manner, demodulates the intermediate frequency signal to obtain an audio frequency signal and an automatic gain control signal. The latter signal is an essentially direct current voltage the magnitude of which corresponds to the strength or magnitude of the average intermediate frequency signal.

In a well known manner the automatic gain control signal is transmitted over lead 7 to the radio frequency amplifier, the oscillator-mixers and intermediate frequency amplifiers 1 to 5 to control the amplification factors thereof. At the same time a second signal, an inverted amplified signal proportional to the gain control signal, is transmitted over lead 8a to a control 8 which supplies a signal over lead 8b to a first stage of an audio amplifier 9 that drives a speaker 10.

The magnitude of the second signal and the response of the audio amplifier to that signal is preferably adjusted so that over at least a portion of the operating range the product of the intermediate frequency signal level at the detector times the amplification factor, or gain, of the audio amplifier is substantially constant. If this relationship is maintained the audio output of the receiver remains constant for wide variations in strength of the received radio frequency signals.

Figure 2:
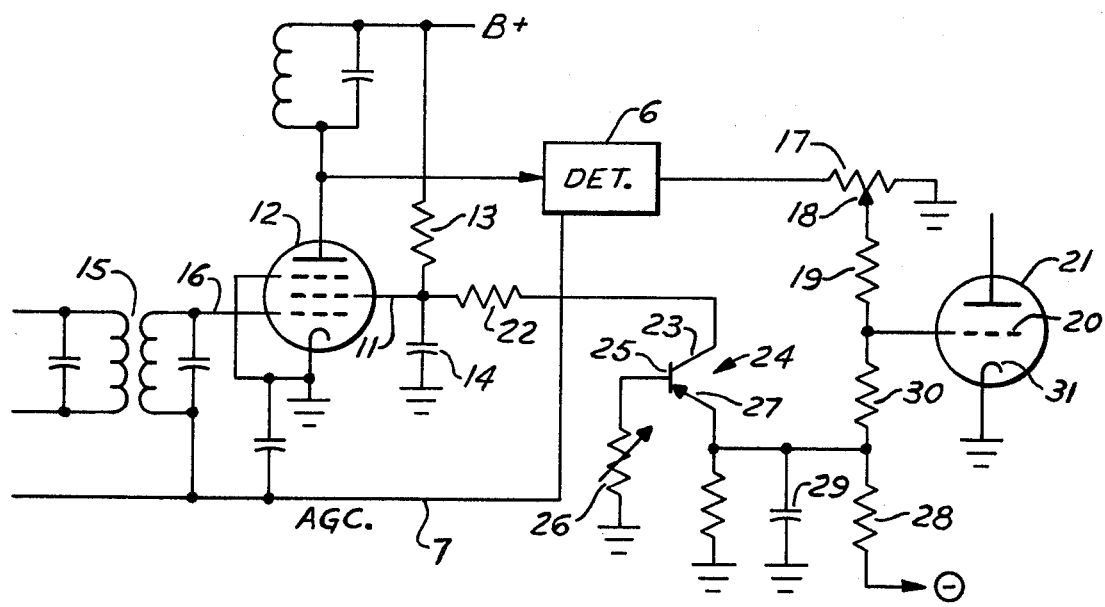
FIG. 2 is a schematic diagram of the circuit details of the supplementary control.

In one form of the invention, as shown in FIG. 2, an amplified automatic gain control signal appears at the screen grid terminal of an intermediate frequency amplifier tube 12. The screen grid section of the tube is used as an amplifier for the automatic gain control signal. In this arrangement a screen resistor 13 serves as the load resistor. A bypass condenser 14 shunts the high frequency signal to ground. In a conventional manner, the intermediate radio frequency signal is transmitted through a tuned transformer 15 to a control grid 16 of the tube 12 while the automatic gain control signal on lead 7 is transmitted through a winding of the transformer 15 to the control grid 16.

The output of the tube 12 is fed to the conventional detector 6, the output of which drives a conventional volume control potentiometer 17 having a slider 18 connected through a resistor 19 to an input grid 20 of an audio input stage tube 21.

The bias voltage on the grid 20 with respect to ground may be positive or negative. The bias voltage is obtained in part from the amplified automatic gain control signal at screen grid terminal 11 and in part from a fixed negative supply voltage. The screen grid terminal 11 is connected through a resistor 22 (e.g. 100,000 ohms) to a collector terminal 23 of a PNP transistor 24. A base 25 of the transistor is connected through a rheostat 26 to chassis ground. Since the collector 23 is positive with respect to the base 25 the collector-base junction acts as a simple forward biased diode. The collector may be directly connected to the base with no change in circuit operation.

An emitter 27 of the transistor is connected to a negative supply voltage through a resistor 28 and to ground through a condenser 29. The emitter 27 is also connected through resistor 30 to the audio amplifier grid 20. The base-emitter junction of the transistor is reverse biased and operates in the break-down region thus providing a five to six volt drop between the base and the emitter.

About half of the bias voltage appearing at the emitter 27 appears at the grid 20 if the bias voltage is negative. If the bias voltage is positive grid current flows from the grid 20 of the tube 21 to its cathode 31 thus reducing the input impedance of the tube.

At the same time, with a negative bias voltage about half of the audio signal voltage on slider 18 is applied to the grid 20 and is amplified. When the bias from the transistor emitter goes positive (increased automatic gain control signal) the grid current flow in the tube 21 reduces its input impedance and thus the signal at the grid 20.

The resistor 19 and the grid-cathode impedance of the tube 21, in effect, form a voltage divider that divides or attenuates the audio signal voltage in an amount determined by the grid-cathode current in the audio amplifier tube 21. As this current increases the amplification of the tube 21 decreases.

The rheostat 26 in combination with the resistor 22 forms a voltage divider to select a portion of the amplified automatic-gain control voltage. This is adjusted so that, for a given amplifier tube 21, the audio output for a given percentage modulation of the radio signal remains constant. In other words the audio output of the radio is practically independent of the strength of the radio signals above a certain level. To reduce the effect of the control on weak signals, the zener effect of the base-emitter path is used to delay the control effect. Thus for weak signals, when the voltage across the rheostat is small, little or no control signal appears at the emitter 27 to provide a change in current through resistor 30.

While the invention has been described as using the screen grid section of the amplifier tube 12 as an amplifier for the automatic gain control signal, any other forms of amplifier may be used that provides an equivalent signal that may be used to control the gain of an audio amplifier of the system.

I claim:

1. An automatic gain control system for a radio receiver comprising, in combination, an intermediate frequency amplifier, a detector connected to the intermediate frequency amplifier, an automatic gain control lead from the detector connected to the intermediate frequency amplifier to vary the amplification generally inversely as the amplitude of the signal applied to the detector, a potentiometer connected to the detector to serve as a volume control, an audio frequency amplifier having an input terminal, a resistor connecting the input terminal to the slider of the potentiometer, an element of the intermediate frequency amplifier having a potential that varies with the potential on the automatic gain control lead, a voltage divider comprising a first resistor and a variable resistor connected between said element and a circuit ground, a semiconductor breakdown device and a second resistor in series connected in parallel with said variable resistor, a third resistor connecting said input terminal to the junction of said semiconductor breakdown device and second resistor, and a fourth resistor connecting said junction to a source of negative potential, whereby the potential of said input terminal varies with the amplitude of the signal of the intermediate amplifier to maintain a constant audio signal from said audio frequency amplifier.

2. An automatic gain control system according to claim 1 in which the semiconductor breakdown device is the base-emitter junction of a transistor.

* * * * *